(12) United States Patent
Kim et al.

(10) Patent No.: US 10,181,281 B2
(45) Date of Patent: Jan. 15, 2019

(54) QUANTUM DOT LIGHT-EMITTING DIODE AND DISPLAY DEVICE INCLUDING THE SAME

(71) Applicant: Samsung Display Co., Ltd., Yongin-si, Gyeonggi-do (KR)

(72) Inventors: Kiseo Kim, Gongju-si (KR); Gee-Bum Kim, Suwon-si (KR); Rangkyun Mok, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 113 days.

(21) Appl. No.: 14/836,862

(22) Filed: Aug. 26, 2015

(65) Prior Publication Data

US 2016/0217732 A1   Jul. 28, 2016

(30) Foreign Application Priority Data

Jan. 26, 2015   (KR) ........................ 10-2015-0012310

(51) Int. Cl.
 *G09G 3/3225*   (2016.01)
 *G09G 3/20*   (2006.01)
 *H01L 51/50*   (2006.01)
 *H01L 27/32*   (2006.01)

(52) U.S. Cl.
 CPC ......... *G09G 3/3225* (2013.01); *G09G 3/2003* (2013.01); *H01L 51/502* (2013.01); *H01L 51/5036* (2013.01); *G09G 2300/0443* (2013.01); *G09G 2320/0242* (2013.01); *H01L 27/3211* (2013.01)

(58) Field of Classification Search
 None
 See application file for complete search history.

(56) References Cited

U.S. PATENT DOCUMENTS

| | | | | |
|---|---|---|---|---|
| 5,537,000 A | * | 7/1996 | Alivisatos | B82Y 20/00 313/498 |
| 2005/0237450 A1 | * | 10/2005 | Hu | G02F 1/133555 349/108 |
| 2009/0001385 A1 | * | 1/2009 | Skipor | B82Y 20/00 257/79 |
| 2009/0001403 A1 | * | 1/2009 | Skipor | H05B 33/10 257/99 |

(Continued)

FOREIGN PATENT DOCUMENTS

| | | |
|---|---|---|
| CN | 101834277 A | 9/2010 |
| KR | 10-1146992 B1 | 5/2012 |

(Continued)

OTHER PUBLICATIONS

Brovelli et al., "Electrochemical Control of Two-Color Emission from Colloidal Dot-in-Bulk Nanocrystals," *NANO Letters*, ACS Publications, © XXXX America Chemical Society, pubs.acs.org/NanoLett, 2014, pp. A-I.

*Primary Examiner* — Chad M Dicke
(74) *Attorney, Agent, or Firm* — Lewis Roca Rothgerber Christie LLP (57) ABSTRACT

A quantum dot light-emitting diode and a display device including the same are disclosed. In one aspect, the display device includes a plurality of pixels, each including a first sub-pixel configured to emit blue light and a second sub-pixel configured to emit different colors of light based on the intensity of an electric field applied thereto.

24 Claims, 5 Drawing Sheets

(56) References Cited

U.S. PATENT DOCUMENTS

| | | | |
|---|---|---|---|
| 2010/0213438 A1* | 8/2010 | Cho | B82Y 20/00 |
| | | | 257/13 |
| 2012/0113671 A1* | 5/2012 | Sadasivan | C09D 11/101 |
| | | | 362/602 |
| 2016/0171917 A1* | 6/2016 | Yang | G09G 3/2003 |
| | | | 345/694 |

FOREIGN PATENT DOCUMENTS

| KR | 10-2013-0026628 A | 3/2013 |
|---|---|---|
| KR | 10-2014-0009876 A | 1/2014 |
| KR | 10-2014-0044568 A | 4/2014 |

* cited by examiner

QUANTUM DOT LIGHT-EMITTING DIODE AND DISPLAY DEVICE INCLUDING THE SAME

INCORPORATION BY REFERENCE TO ANY PRIORITY APPLICATIONS

This U.S. non-provisional patent application claims priority under 35 U.S.C. § 119 of Korean Patent Application No. 10-2015-0012310, filed on Jan. 26, 2015, the contents of which are hereby incorporated by reference in its entirety.

BACKGROUND

Field

The described technology generally relates to a quantum dot light-emitting diode and display device including the same.

Description of the Related Technology

As society has developed rapidly in the information age, the prominence of a display device as a visual information transmission medium keeps increasing. The display needs to meet design requirements, such as low power consumption, thin profile, lightweight, high definition, etc. In recent years, a quantum dot light-emitting diode (QD-LED) has been actively researched since the QD-LED has favorable characteristics such as being slim, having high color purity, having long operation times, displaying with light-emitting material, etc.

A quantum dot is a semiconductor nano particle. QD-LED display uses the quantum dot as a material of a light-emitting layer instead of an organic light-emitting material in organic light-emitting diode (OLED) displays. An OLED display a single color, e.g., red, green, or blue, and thus, each OLED cannot emit a wide variety of colors. However, the QD-LED controls positions of where an electron and a hole are combined to emit a spectrum of hues. Therefore, the QD-LED has high color reproducibility and high brightness compared to an OLED, and the QD-LED display has been considered as a next generation light source.

SUMMARY OF CERTAIN INVENTIVE ASPECTS

One inventive aspect relates to a quantum dot light-emitting diode (QD-LED) and a display device having the QD-LED.

Another aspect is a display device including a plurality of pixels. Each of the pixels includes a first sub-pixel emitting a blue light and a second sub-pixel controlling a light-emitting color of a light emitted therefrom in response to an electric field applied thereto.

The second sub-pixel includes a first electrode, an electron transport region formed on the first electrode, a color control light-emitting layer formed on the electron transport region, a hole transport region formed on the color control light-emitting layer, a second electrode formed on the hole transport region, an insulating layer formed on the second electrode, and a color control electrode formed on the insulating layer.

The color control light-emitting layer is a quantum dot light-emitting layer.

The second electrode is an electric field transmissive electrode.

The color control electrode applies an electric field to the color control light-emitting layer to control the light-emitting color of the color control light-emitting layer.

The light-emitting color has a wavelength controlled in a range from a first wavelength to a second wavelength in response to the electric field.

The first wavelength corresponds to a green color and the second wavelength corresponds to a red color.

The first wavelength is about 500 nm and the second wavelength is about 800 nm.

When the color control electrode is a cathode, the wavelength of the light-emitting color becomes short as an intensity of the electric field applied to the color control light-emitting layer increases and the wavelength of the light-emitting color becomes long as the intensity of the electric field applied to the color control light-emitting layer decreases.

The display device further includes an image processor that processes image data to allow the image data to correspond to a layout of the first and second sub-pixels included in each of the pixels.

The image data comprise red, green, and blue data.

The image processor processes the image data to generate compensation data and to output the compensation data.

The compensation data include second electrode data about a voltage applied to the second electrode, color control electrode data about a voltage applied to the color control electrode, and the blue data about a voltage.

The second electrode data are calculated by the following equation 1 of $C1=k1 \cdot (R+G)$, where C1 denotes the second electrode data, k1 denotes a constant determined depending on the light-emitting efficiency of the color control light-emitting layer, R denotes the red data, and G denotes the green data.

The color control electrode data are calculated by the following equation 2 of $C2=k2 \cdot (R/(R+G))+k3$, where C2 denotes the color control electrode data, k2 denotes a constant determined depending on the light-emitting efficiency of the color control light-emitting layer, k3 denotes a constant determined depending on a threshold voltage required to drive the color control light-emitting layer, R denotes the red data, and G denotes the green data.

The pixels are arranged in a first direction and a second direction substantially perpendicular to the first direction.

When the pixels are arranged in the first and second directions, the first sub-pixels arranged in the first direction are defined as first sub-pixel columns, the second sub-pixels arranged in the first direction are defined as second sub-pixel columns, and the first sub-pixel columns are alternately arranged with the second sub-pixel columns in the second direction.

The first and second sub-pixels are alternately arranged in the first and second directions.

Another aspect is a quantum dot light-emitting diode including a first electrode, an electron transport region formed on the first electrode, a color control light-emitting layer formed on the electron transport region, a hole transport region formed on the color control light-emitting layer, a second electrode formed on the hole transport region, an insulating layer formed on the second electrode, and a color control electrode formed on the insulating layer. The color control light-emitting layer is a quantum dot light-emitting layer and controls a light-emitting color of a light emitted therefrom in response to an electric field applied thereto by the color control electrode.

The second electrode is an electric field transmissive electrode.

The light-emitting color has a wavelength controlled in a range from a first wavelength to a second wavelength in response to the electric field.

The first wavelength corresponds to a green color and the second wavelength corresponds to a red color.

The first wavelength is about 500 nm and the second wavelength is about 800 nm.

Another aspect is a display device comprising a plurality of pixels. Each of the pixels comprises: a first sub-pixel configured to emit blue light; and a second sub-pixel configured to emit different colors of light based on the intensity of an electric field applied thereto.

In the above display device, the second sub-pixel comprises: a first electrode; an electron transport region formed over the first electrode; a color control light-emitting layer formed over the electron transport region; a hole transport region formed over the color control light-emitting layer; a second electrode formed over the hole transport region; an insulating layer formed over the second electrode; and a color control electrode formed over the insulating layer.

In the above display device, the color control light-emitting layer comprises a quantum dot light-emitting layer.

In the above display device, the second electrode comprises an electric field transmissive electrode.

In the above display device, the color control electrode is configured to apply an electric field to the color control light-emitting layer so as to control the light-emitting color of the color control light-emitting layer.

In the above display device, the light-emitting color has a wavelength in the range from a first wavelength to a second wavelength that are determined based on the electric field.

In the above display device, the first wavelength corresponds to a green color, wherein the second wavelength corresponds to a red color.

In the above display device, the first wavelength is about 500 nm, wherein the second wavelength is about 800 nm.

In the above display device, when the color control electrode is a cathode, the wavelength of the light-emitting color is configured to become i) shorter as an intensity of the electric field applied to the color control light-emitting layer increases and ii) longer as the intensity of the electric field applied to the color control light-emitting layer decreases.

The above display device further comprises an image processor configured to process image data corresponding to a layout of the first and second sub-pixels.

In the above display device, the image data comprises red, green, and blue data.

In the above display device, the image processor is further configured to i) process the image data so as to generate compensation data and ii) output the compensation data.

In the above display device, the compensation data comprises second electrode data corresponding to a voltage applied to the second electrode, color control electrode data corresponding to a voltage applied to the color control electrode, and the blue data.

In the above display device, the image processor is configured to calculate the second electrode data based on the following Equation 1, $$C1 = k1 \cdot (R+G), \quad \text{Equation 1}$$

where C1 denotes the second electrode data, k1 denotes a constant determined depending on the light-emitting efficiency of the color control light-emitting layer, R denotes the red data, and G denotes the green data.

In the above display device, the image processor is configured to calculate the color control electrode data based on the following Equation 2, $$C2 = k2 \cdot (R/(R+G)) + k3, \quad \text{Equation 2}$$

where C2 denotes the color control electrode data, k2 denotes a constant determined depending on the light-emitting efficiency of the color control light-emitting layer, k3 denotes a constant determined depending on a threshold voltage required to drive the color control light-emitting layer, R denotes the red data, and G denotes the green data.

In the above display device, the pixels are arranged in first and second directions crossing each other.

In the above display device, the first sub-pixels arranged in the first direction are defined as first sub-pixel columns, wherein the second sub-pixels arranged in the first direction are defined as second sub-pixel columns, and wherein the first and second sub-pixel columns are alternately arranged in the second direction.

In the above display device, the first and second sub-pixels are alternately arranged in the first and second directions.

Another aspect is a quantum dot light-emitting diode (QD-LED) comprising: a first electrode; an electron transport region formed over the first electrode; a color control light-emitting layer formed over the electron transport region; a hole transport region formed over the color control light-emitting layer; a second electrode formed over the hole transport region; an insulating layer formed over the second electrode; and a color control electrode formed over the insulating layer, wherein the color control light-emitting layer comprises a quantum dot light-emitting layer and configured to emit light having a light-emitting color based on an electric field applied to the color control light-emitting layer via the color control electrode.

In the above QD-LED, the second electrode comprises an electric field transmissive electrode.

In the above QD-LED, the light-emitting color has a wavelength in the range from a first wavelength to a second wavelength that are determined based on the electric field.

In the above QD-LED, the first wavelength corresponds to a green color, and wherein the second wavelength corresponds to a red color.

In the above QD-LED, the first wavelength is about 500 nm, and wherein the second wavelength is about 800 nm.

According to at least one of the disclosed embodiments, since the number of the sub-pixels forming one pixel, a resolution of the display device is improved.

DETAILED DESCRIPTION OF CERTAIN INVENTIVE EMBODIMENTS

It will be understood that when an element or layer is referred to as being "on", "connected to" or "coupled to"

another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
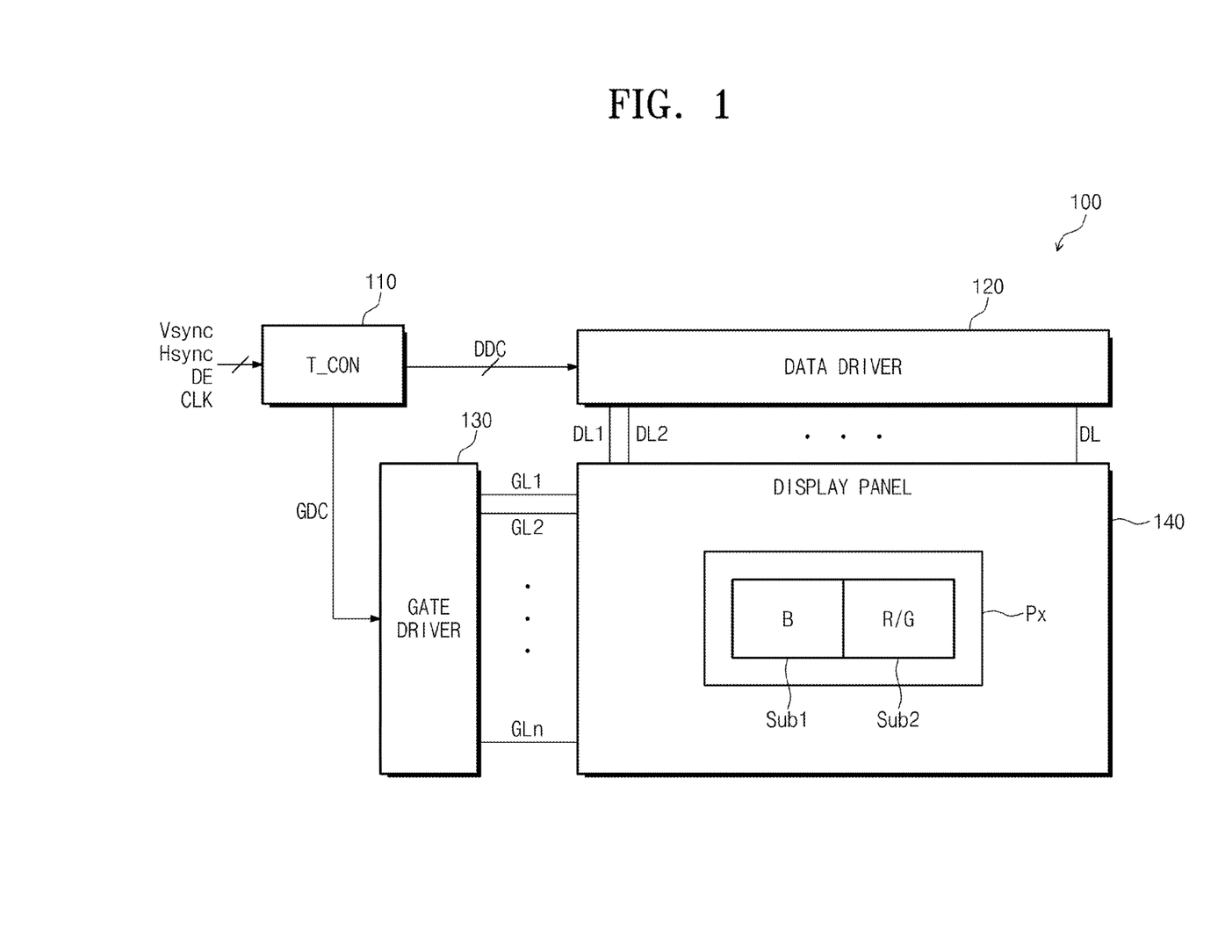
FIG. 1 is a block diagram showing a display device according to an exemplary embodiment.

FIG. 1 is a block diagram showing a display device 100 according to an exemplary embodiment. Depending on embodiments, certain elements can be removed from or additional elements can be added to the display device 100 illustrated in FIG. 1. Furthermore, two or more elements can be combined into a single element, or a single element may be realized as multiple elements. This applies to the remaining apparatus embodiments.

Referring to FIG. 1, the display device 100 includes a display panel 140, a timing controller 110, a data driver 120, and a gate driver 130.

The timing controller 110 generates a data control signal DDC to control an operation timing of the data driver 120 and a gate control signal GDC to control an operation timing of the gate driver 130 on the basis of timing signals, such as a vertical synchronization signal Vsync, a horizontal synchronization signal Hsync, a clock signal CLK, a data enable signal DE, etc.

The data driver 120 generates data signals in response to the data control signal DDC provided from the timing controller 110. The data driver 120 applies the data signals to the pixels included in the display panel 140 through data lines DL1 to DLn connected thereto.

The gate driver 130 generates gate signals in response to the gate control signal GDC provided from the timing controller 110. The gate driver 130 applies the gate signals to the pixels through gate lines GL1 to GLn connected thereto.

The data lines DL1 to DLn and the gate lines GL1 to GLn are formed on the display panel 140 to cross each other and the pixels are arranged in areas defined in association with the data lines DL1 to DLn and the gate lines GL1 to GLn.

Each of the pixels Px includes two sub-pixels Sub1 and Sub2, i.e., first and second sub-pixels Sub1 and Sub2.

The first sub-pixel Sub1 emits the light with a predetermined color in response to the data signal applied thereto. For instance, the first sub-pixel Sub1 emits the blue light. The first sub-pixel Sub1 can be, but not limited to, a quantum dot light-emitting diode QD-LED or an organic light-emitting diode OLED.

The second sub-pixel Sub2 emits lights with various colors in response to the data signals applied thereto. For instance, the second sub-pixel Sub2 emits the light with a specific wavelength in a range from a first wavelength to a second wavelength in response to the data signal applied thereto. The first wavelength corresponds to a green color, e.g., about 500 nm, and the second wavelength corresponds to a red color, e.g., about 800 nm. Accordingly, although the pixel Px includes two sub-pixels Sub1 and Sub2, the pixel Px can emit the red, green, and blue light.

Since the second sub-pixel Sub2 includes the quantum dot light-emitting diode QD-LED, the second sub-pixel Sub2 emits the light with various colors by controlling the electric field applied to the second sub-pixel Sub2. The mechanism with which the quantum dot light-emitting diode QD-LED emits light with various colors will be described in detail with reference to FIGS. 2 to 4.

Figure 2:
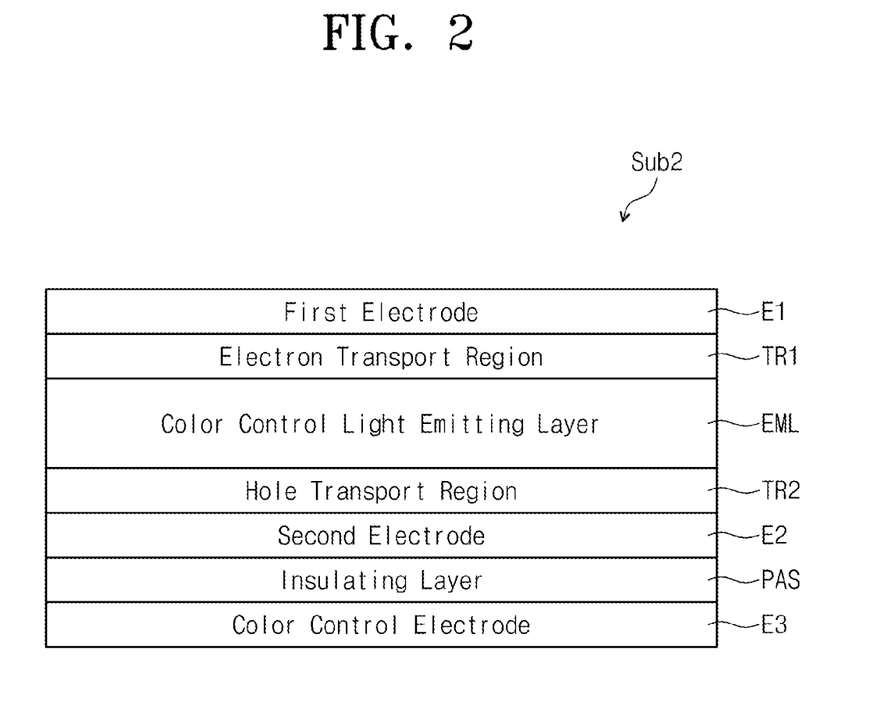
FIG. 2 is a cross-sectional view showing a second sub-pixel.
Figure 3:
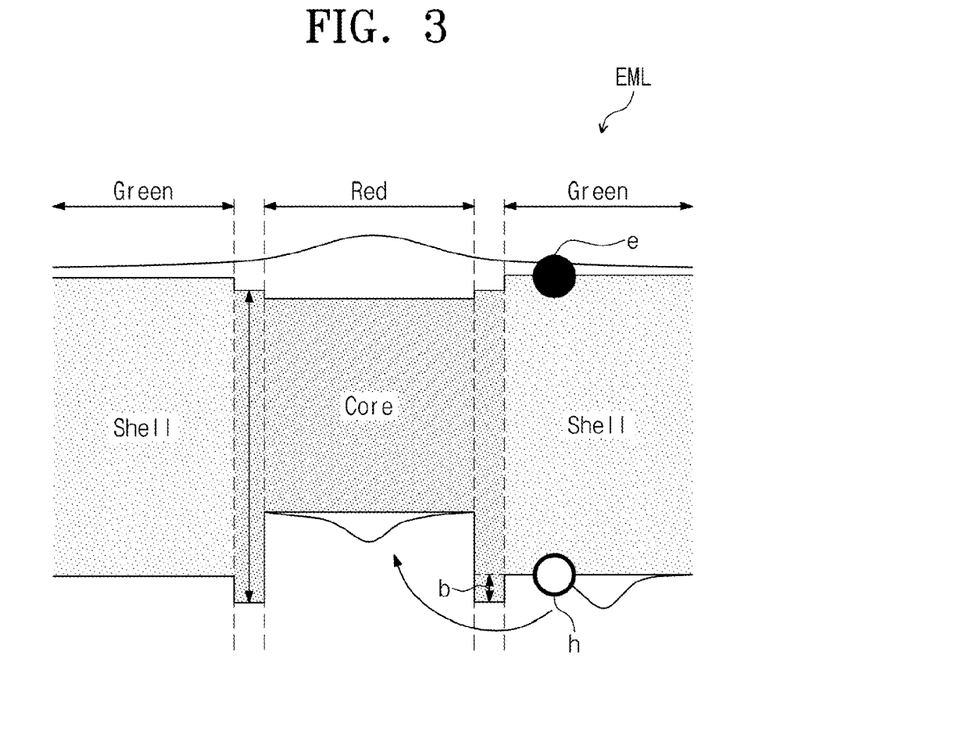
FIG. 3 is an energy band gap diagram showing a color control light-emitting layer.
Figure 4:
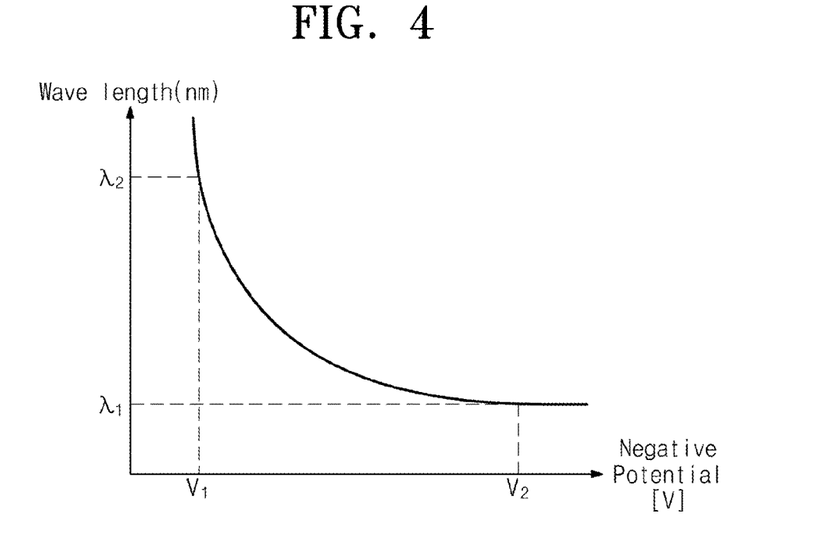
FIG. 4 is a graph showing a relationship between an electric field applied to the color control light-emitting layer by a color control electrode and a wavelength of a light emitted from the color control light-emitting layer.

FIG. 2 is a cross-sectional view showing a second sub-pixel. FIG. 3 is an energy band gap diagram showing a color control light-emitting layer. FIG. 4 is a graph showing a relationship between an electric field applied to the color control light-emitting layer by a color control electrode and a wavelength of a light emitted from the color control light-emitting layer.

Referring to FIG. 2, the second sub-pixel Sub2 includes a first electrode E1, an electron transport region TR1, and a color control light-emitting layer EML, a hole transport region TR2, a second electrode E2, an insulating layer PAS, and a color control electrode E3.

The first electrode E1 is a common electrode or a cathode electrode. The first electrode E1 can be a transmissive electrode, a transflective electrode, or a reflective electrode. When the first electrode E1 is the transmissive electrode, the first electrode E1 includes Li, Ca, LiF/Ca, LiF/Al, Al, Mg, BaF, Ba, Ag, or a compound or a mixture thereof, e.g., a mixture of Ag and Mg.

The first electrode E1 can include an auxiliary electrode. The auxiliary electrode includes a layer formed by depositing the material toward the color control light-emitting layer EML and a transparent metal oxide formed on the layer, e.g., indium tin oxide (ITO), indium zinc oxide (IZO), zinc oxide (ZnO), indium tin zinc oxide (ITZO), Mo, Ti, etc.

When the first electrode E1 is the transflective electrode or the reflective electrode, the first electrode E1 includes Ag, Mg, Al, Pt, Pd, Au, Ni, Nd, Ir, Cr, Li, Ca, LiF/Ca, LiF/Al, Mo, Ti, or a compound or mixture thereof, e.g., a mixture of Ag and Mg. In addition, the first electrode E1 can have a multi-layer structure of a reflective or transflective layer formed of the material and a transparent conductive layer of ITO, IZO, ZnO, ITZO, etc.

The electron transport region TR1 is formed on the first electrode E1.

The electron transport region TR1 includes at least one of a hole block layer, an electron transport layer, and an electron injection layer, but it should not be limited thereto or thereby. For instance, the electron transport region TR1 has a structure of the electron injection layer/electron transport layer or the electron injection layer/electron transport layer/hole block layer, which are sequentially stacked on the first electrode E1, but the electron transport region TR1 can have a single-layer structure configured to include two or more layers of the above-mentioned layers.

The electron transport region TR1 can be formed by various methods, such as a vacuum deposition method, a spin coating method, a casting method, a Langmuir-Blodgett (LB), an inkjet printing method, a laser printing method, a laser induced thermal imaging (LITI), etc.

When the electron transport region TR1 includes the electron transport layer, the electron transport region TR1 includes Alq3(Tris(8-hydroxyquinolinato)aluminum), TPBi (1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl)anthracene), and a mixture thereof, but it should not be limited thereto or thereby.

The electron transport layer has a thickness in the range of about 100 angstroms to about 1000 angstroms. For example, the thickness is in the range of about 150 angstroms to about 500 angstroms. When the thickness of the electron transport layer is in the above-mentioned range, superior electron transport characteristics can be obtained without increasing a driving voltage. However, depending on the embodiments, the thickness can be less than about 100 angstroms or greater than about 1000 angstroms.

When the electron transport TR1 includes the electron injection layer, the electron transport region TR1 is formed of a lanthanum-group metal, e.g., LiF, LiQ (lithium quinolate), Li2O, BaO, NaCl, CsF, Yb, etc., or a halide metal, e.g., RbCl, RbI, etc., but it should not be limited thereto or thereby.

The electron injection layer includes a material obtained by mixing an electron transport material with an organic metal salt having insulating property. The organic metal salt has an energy band gap of about 4 ev. In detail, the organic metal salt includes metal acetate, metal benzoate, metal acetoacetate, metal acetylacetonate, or metal stearate.

The electron injection layer has a thickness in the range of about 1 angstrom to about 100 angstroms. For example, the thickness is in the range of about 3 angstroms to about 90 angstroms. When the thickness of the electron injection layer is in the above-mentioned range, superior electron injection characteristics can be obtained without increasing the driving voltage. However, depending on the embodiments, the thickness can be less than about 1 angstrom or greater than about 100 angstroms.

As described above, the electron transport region TR1 can include the hole block layer. The hole block layer is formed of at least one of BCP(2,9-dimethyl-4,7-diphenyl-1,10-phenanthroline) and Bphen(4,7-diphenyl-1,10-phenanthroline), but it should not be limited thereto or thereby.

The hole block layer has a thickness of about 20 angstroms to about 1000 angstroms. For example, the thickness is in the range of about 30 angstroms to about 300 angstroms. When the thickness of the hole block layer is in the above-mentioned range, superior hole block characteristics can be obtained without increasing the driving voltage. However, depending on the embodiments, the thickness can be less than about 20 angstroms or greater than about 1000 angstroms.

The color control light-emitting layer EML is formed on the electron transport region TR1.

The color control light-emitting layer EML is a quantum dot light-emitting layer including quantum dots each having a diameter of about 1 nm to about 100 nm of 2 group-6 group pair or 3 group-5 group pair nano-semiconductor compound. For instance, the nano-semiconductor compound is any one selected from cadmium selenide (CdSe), cadmium sulfide (CdS), Cadmium telluride (CdTe), zinc selenide (ZnSe), zinc telluride (ZnTe), zinc sulfide (ZnS), mercury telluride (HgTe), indium arsenide (InAs), Cd1-xZnxSe1-ySy', CdSe/ZnS, indium phosphorus (InP), and gallium arsenide (GaAs).

Each quantum dot includes a core, a shell surrounding the core to protect a surface of the core, and a ligand attached to a surface of the shell. The ligand is removed when the quantum dot light-emitting layer is formed.

The color control light-emitting layer EML includes quantum dots, each having a diameter of nanometers, and is formed by providing quantum dots to solvent, coating the solvent, in which the quantum dots are distributed, on the electron transport region TR1 through a solution process, and volatilizing the solvent.

The color control light-emitting layer EML can emit light with various colors in accordance with positions each at which a hole is combined with an electron, which are injected from an external source. For example, the color control light-emitting layer EML emits light with the colors in the range from the first wavelength to the second wavelength in accordance with the positions each at which the hole is combined with the electron in the color control light-emitting layer EML. Here, the first wavelength corresponds to the green color, e.g., about 500 nm, and the second wavelength corresponds to the red color, e.g., about 800 nm. The positions, each at which the hole is combined with the electron in the color control light-emitting layer EML, are controlled by the electric field generated by the color control electrode E3 described later.

The hole transport region TR2 is formed on the color control light-emitting layer EML.

The hole transport region TR2 includes at least one of a hole injection layer, a hole transport layer, a buffer layer, and an electron block layer.

The hole transport region TR2 has a single-layer structure formed of a single material, a single-layer structure formed of different materials from each other, or a multi-layer structure formed of different materials from each other.

For instance, the hole transport region TR2 has the single-layer structure formed of different materials from each other or a structure of the hole transport layer/hole injection layer, the buffer layer/hole transport layer/hole injection layer, the buffer layer/hole injection layer, the buffer layer/hole transport layer, or the electron block layer/hole transport layer/hole injection layer, but it should not be limited thereto or thereby.

The hole transport region TR2 can be formed by various methods, such as a vacuum deposition method, a spin coating method, a casting method, a Langmuir-Blodgett (LB), an inkjet printing method, a laser printing method, a laser induced thermal imaging (LITI), etc.

When the hole transport region TR2 includes the hole injection layer, the hole transport region TR2 includes phthalocyanine compound of copper phthalocyanine; DNTPD (N,N'-diphenyl-N,N'-bis-[4-(phenyl-m-tolyl-amino)-phenyl]-biphenyl-4,4'-diamine), m-MTDATA(4,4', 4"-tris(3-methylphenylphenylamino)triphenylamine), TDATA(4,4'4"-Tris(N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonic acid), PANI/PSS((Polyaniline)/Poly(4-styrenesulfonate)), but it should not be limited thereto or thereby.

When the hole transport region TR2 includes the hole transport layer, the hole transport region TR2 includes carbazole-based derivatives, such as N-phenyl carbazole, polyvinyl carbazole, etc., fluorine-based derivatives, triphenylamine-based derivatives, such as TPD(N,N'-bis(3-methylphenyl)-N,N-diphenyl-[1,1-biphenyl]-4,4'-diamine), TCTA(4,4',4"-tris(N-carbazolyl)triphenylamine), etc., NPB (N,N'-di(1-naphthyl)-N,N-diphenylbenzidine), and TAPC (4,4'-Cyclohexylidene bis[N,N-bis(4-methylphenyl)benzenamine]), but it should not be limited thereto or thereby.

The hole transport region TR2 has a thickness in the range of about 100 angstroms to about 10000 angstroms. For example, the thickness is in the range of about 100 angstroms to about 1000 angstroms. However, depending on the embodiments, the thickness can be less than about 100 angstroms or greater than about 10000 angstroms. When the hole transport region TR2 includes the hole injection layer and the hole transport layer, the hole injection layer has a thickness in the range of about 100 angstroms to about 10000 angstroms. For example, the thickness is in the range of about 100 angstroms to about 1000 angstroms. However, depending on the embodiments, the thickness can be less than about 100 angstroms or greater than about 10000 angstroms. In some embodiments, the hole transport layer has a thickness in the range of about 50 angstroms to about 2000 angstroms. For example, the thickness is in the range of about 100 angstroms to about 1500 angstroms. However, depending on the embodiments, the thickness can be less than about 50 angstroms or greater than about 2000 angstroms. When the thicknesses of the hole transport region TR2, the hole injection layer, and the hole transport layer are in the above-mentioned ranges, superior hole transport characteristics can be obtained without increasing the driving voltage.

The hole transport region TR2 can further be formed of an electric charge generating material to improve the conductivity thereof. The electric charge generating material can be regularly dispersed in the hole transport region TR2. For instance, the electric charge generating material can be a p-dopant, and the p-dopant can be a quinone derivative, a metal oxide, or a cyano group-containing compound, but it should not be limited thereto or thereby.

That is, the p-dopant includes quinone derivatives such as TCNQ(Tetracyanoquinodimethane), F4-TCNQ(2,3,5,6-tetrafluoro-tetracyanoquinodimethane), etc., or the metal oxide such as tungsten oxide, molybdenum oxide, etc., but it should not be limited thereto or thereby.

As described above, the hole transport region TR2 further includes at least one of the buffer layer and the electron block layer in addition to the hole injection layer and the hole transport layer. The buffer layer compensates for a resonance distance in accordance with a wavelength of the light exiting from the color control light-emitting layer EML to enhance the light emission efficiency of the color control light-emitting layer EML. The material included in the hole transport region TR2 can be included in the buffer layer. The electron block layer prevents the electrons from being injected to the hole transport region TR2 from the electron transport region TR1.

The second electrode E2 is formed on the hole transport region TR2.

The second electrode E2 can be a pixel electrode or an anode electrode. The second electrode E2 can be an electric field transmissive electrode. For instance, the second electrode E2 can include graphene, metal nano mesh, etc., but it should not be limited thereto or thereby. The second electrode E2 can include various materials as long as it can transmit the electric field. The second electrode E2 transmits the electric field applied by the color control electrode E3, and thus the electric field is applied to the color control light-emitting layer EML.

The insulating layer PAS is formed on the second electrode E2. The insulating layer PAS insulates the second electrode E2 from the color control electrode E3. The insulating layer PAS be formed of an organic or inorganic material.

The color control electrode E3 is formed on the insulating layer PAS.

The color control electrode E3 applies the electric field to the color control light-emitting layer EML to determine the color of the light emitted from the color control light-emitting layer EML. The color control electrode E3 controls intensity of the electric field applied to the color control light-emitting layer EML and applies energy to holes or electrons in the color control light-emitting layer EML, thereby controlling the positions at which the holes are combined with the electrons. When the holes are combined with the electrons, excitons are generated and the light is emitted. The wavelength of the emitting light is controlled in the range from the first wavelength to the second wavelength in accordance with the positions at which the holes are combined with the electrons. Here, the first wavelength is the wavelength corresponding to the green color and the second wavelength is the wavelength corresponding to the red color.

The color control electrode E3 is a cathode or an anode.

When the color control electrode E3 is the cathode, the color control electrode E3 increases the intensity of the electric field applied to the color control light-emitting layer EML to allow the color control light-emitting layer EML to emit the light having the wavelength that is close to the first wavelength. On the contrary, the color control electrode E3 can decrease the intensity of the electric field applied to the color control light-emitting layer EML to allow the color control light-emitting layer EML to emit the light having the wavelength that is close to the second wavelength. That is, when the color control electrode E3 is the cathode, the wavelength of the light emitted from the color control light-emitting layer EML is shortened as the intensity of the electric field generated by the color control electrode E3 increases, and lengthened as the intensity of the electric field generated by the color control electrode E3 decreases.

Referring to FIG. 3, the core exists at the center of the quantum dot included in the color control light-emitting layer EML and the surface of the core is surrounded by the shell. The hole h provided from the hole transport region TR2 and the electron e provided from the electron transport region TR1 are combined with each other in the core or shell.

When the hole h is combined with the electron e in the shell to generate the exciton, the light having the first wavelength is generated when the exciton returns to a ground state from an excited state. When the hole h is combined with the electron e in the core to generate the exciton, the light having the second wavelength is generated when the exciton returns to the ground state from the excited state. Accordingly, as an amount of the exciton generated in the shell is relatively large, the green-based light is generated, and as an amount of the exciton generated in the core is relatively large, the red-based light is generated.

The core has a HOMO energy level different from that of the shell and a constant energy barrier b exists between the core and the shell. Therefore, the exciton is generally generated in the shell, and thus the green-based light is generated. However, when the number of the holes h, which have energy enough to overcome the energy barrier b, is relatively high, the exciton is generated in the core, and thus the red-based light is generated.

Thus, the color control electrode E3 applies the electric field to the color control light-emitting layer EML to control the energy of the hole h, thereby controlling the position at which the exciton is generated. As a result, the color of the light emitted from the color control light-emitting layer EML can be controlled.

Referring to FIG. 4, since the color control electrode E3 is the cathode, the energy of the hole h is reduced as the intensity of the electric field applied to the color control light-emitting layer EML increases, and thus the number of the exciton generated in the shell increases. As a result, the color control light-emitting layer EML emits a green-based light having a short wavelength $\lambda 1$. On the contrary, the energy of the hole h increases as the intensity of the electric field applied to the color control light-emitting layer EML decreases, and thus the number of the exciton generated in the core increases. As a result, the color control light-emitting layer EML emits a red-based light having a long wavelength $\lambda 2$.

That is, when the color control electrode E3 is the cathode, the intensity of the electric field of the color control electrode E3 is in inverse proportion to the wavelength of the light emitted from the color control light-emitting layer EML.

When the color control electrode E3 is the anode, the color control electrode E3 decreases the intensity of the electric field applied to the color control light-emitting layer EML to allow the color control light-emitting layer EML to emit the green-based light of a wavelength closer to the first wavelength $\lambda 1$. On the contrary, the color control electrode E3 increases the intensity of the electric field applied to the color control light-emitting layer EML to allow the color control light-emitting layer EML to emit the red-based light of a wavelength closer to the second wavelength $\lambda 2$. That is, when the color control electrode E3 is the anode, the intensity of the electric field of the color control electrode E3 is in proportion to the wavelength of the light emitted from the color control light-emitting layer EML.

Therefore, manufacturers can determine the polarity of the color control electrode E3 by taking light-emitting efficiency of the quantum dot light-emitting diode, the first and second electrodes E1 and e2, mobility of electron e or hole h, and manufacturing method into consideration.

Referring to FIG. 2 again, the color control electrode E3 and the insulating layer PAS are formed on the first electrode E1. In this case, the insulating layer PAS is formed between the color control electrode E3 and the first electrode E1, and the first electrode E1 is the electric field transmissive electrode. The color control electrode E3 applies the electric field to the color control light-emitting layer EML through the first electrode E1 and the energy of the electrons in the color control light-emitting layer EML is controlled, thereby controlling the color of the light emitted from the color control light-emitting layer EML.

Figure 5:
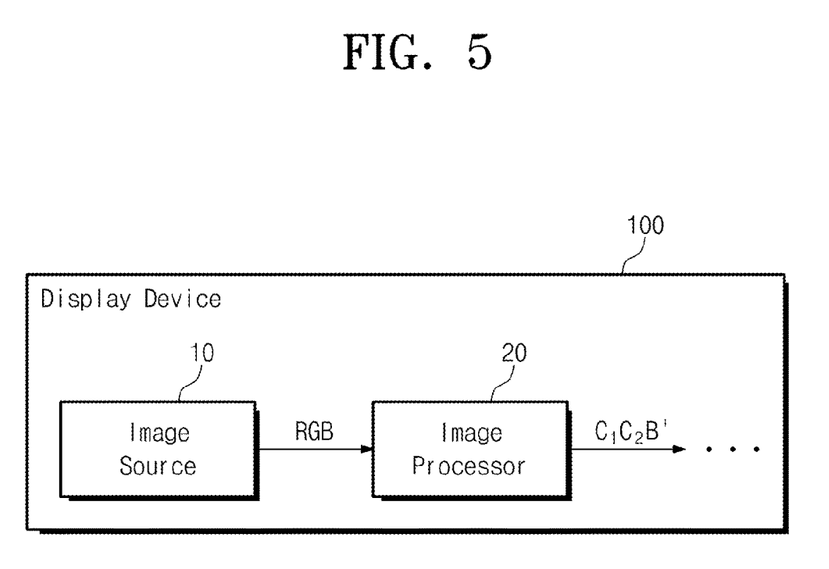
FIG. 5 is a block diagram showing a display device according to an exemplary embodiment of the present disclosure.

FIG. 5 is a block diagram showing a display device 100 according to an exemplary embodiment.

Referring to FIG. 5, the display device 100 includes an image source 10 and an image processor 20.

The image source 10 generates image data RGB including red, green, and blue data RGB. The image data RGB correspond to data in an RGB color space, which include red, green, and blue colors as a base configuration. The RGB color space combines colors using a process where the white color is obtained by combining three primary colors, i.e., red, green, and blue colors.

The image processor 20 receives the image data RGB output from the image source 10. The image processor 20 processes the image data RGB to generate compensation data C1C2B' corresponding to a layout of the first and second sub-pixels Sub1 and Sub2 included in each pixel Px.

The compensation data C1C2B' includes second electrode data C1 regarding a voltage applied to the second electrode E2 of the second sub-pixel Sub2, color control electrode data C2 regarding a voltage applied to the color control electrode E3 of the second sub-pixel Sub2, and blue data B' regarding a voltage applied to the electrode of the first sub-pixel Sub1.

The image processor 20 generates the second electrode data C1 using the red and green data R and G included in the image data RGB. The image processor 20 applies the red and green data R and G to the following Equation 1 to calculate the second electrode data C1 of the compensation data C1C2B'.

$$C1 = k1 \cdot (R+G) \qquad \text{Equation 1}$$

In equation 1, C1 denotes the second electrode data, k1 denotes a constant determined depending on the light-emitting efficiency of the color control light-emitting layer EML, R denotes the red data, and G denotes the green data.

The image processor 20 generates the color control electrode data C2 of the compensation data C1C2B' using the red and green data R and G included in the image data RGB. The image processor 20 applies the red and green data R and G to the following Equation 2 to calculate the color control electrode data C2 of the compensation data C1C2B'.

$$C2 = k2 \cdot (R/(R+G)) + k3 \qquad \text{Equation 2}$$

In Equation 2, C2 denotes the color control electrode data, k2 denotes a constant determined depending on the light-emitting efficiency of the color control light-emitting layer EML, k3 denotes a constant determined depending on a threshold voltage required to drive the color control light-emitting layer EML, R denotes the red data, and G denotes the green data.

The image processor 20 outputs the blue data B included in the image data RGB applied thereto as blue data B' of the compensation data C1C2B' without changing the blue data B.

However, the method of generating the compensation data C1C2B' corresponding to the layout of the first and second sub-pixels Sub1 and Sub2 should not be limited to the above-mentioned method. That is, the image processor 20 can generate the compensation data C1C2B' corresponding to the layout of the first and second sub-pixels Sub1 and Sub2 using various methods.

The image processor 20 outputs the compensation data C1C2B' generated. The compensation data C1C2B' output from the image processor 20 are applied to the pixels Px of the display panel 140 in the form of a data signal.

Figure 6A:
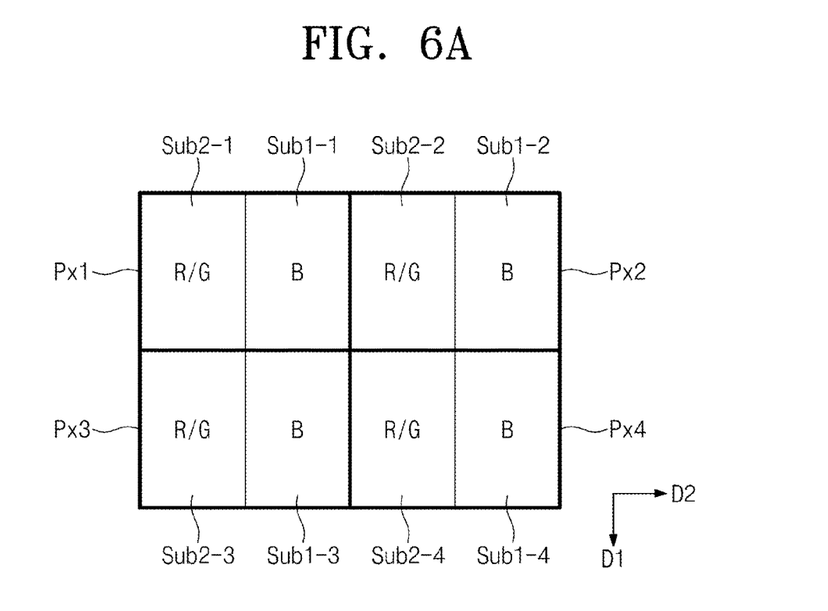
FIGS. 6A and 6B are views showing layouts of sub-pixels according to exemplary embodiments.
Figure 6B:
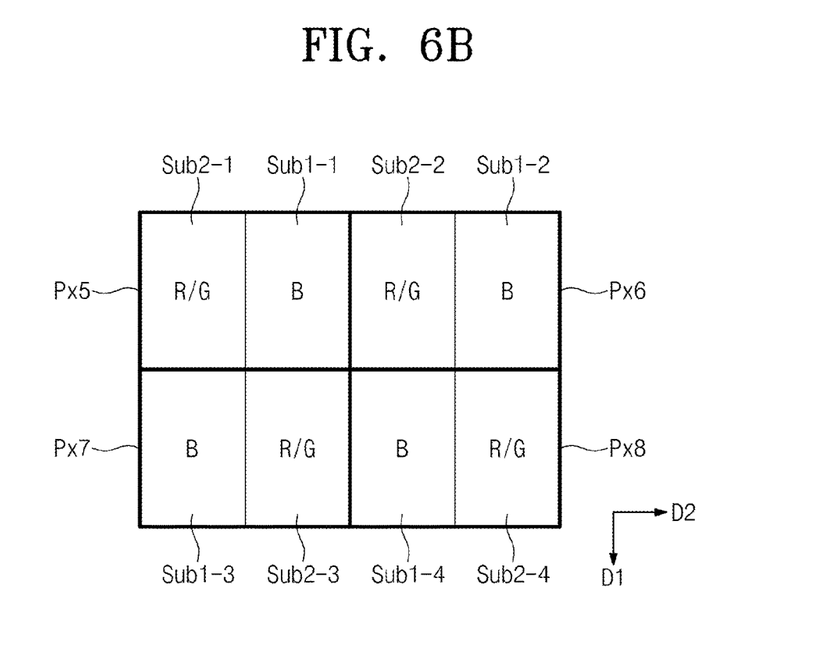

FIGS. 6A and 6B are views showing layouts of sub-pixels according to exemplary embodiments of the present disclosure.

Referring to FIGS. 6A and 6B, pixels Px1 to Px8 are arranged in first and second directions D1 and D2 crossing each other on the display panel 140. In this case, first sub-pixels Sub1-1 to Sub1-4 are alternately arranged with second sub-pixels Sub2-1 to Sub2-4 in the unit of column, or each of the first sub-pixels Sub1-1 to Sub1-4 is alternately arranged with each of the second sub-pixels Sub2-1 to Sub2-4.

For instance, when the pixels Px1 to Px4 are arranged in the first and second directions D1 and D2 as shown in FIG. 6A, the first sub-pixels Sub1-1 to Sub1-4 arranged in the first direction D1 are defined as a first sub-pixel column and the second sub-pixels Sub2-1 to Sub2-4 arranged in the first direction D1 are defined as a second sub-pixel column. In this case, the first and second sub-pixel columns are alternately arranged with each other along the second direction D2.

As another example, as shown in FIG. 6B, when the pixels Px5 to Px8 are arranged in the first and second directions D1 and D2 as shown in FIG. 6B, each of the first sub-pixels Sub1-1 to Sub1-4 is alternately arranged with each of the second sub-pixels Sub2-1 to Sub2-4 along the first and second directions D1 and D2.

However, the arrangement of the sub-pixels Sub1 and Sub2 should not be limited to the above-mentioned arrangement.

Although the inventive technology has been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
a plurality of pixels, wherein each of the plurality of pixels consists of:
a first sub-pixel configured to emit blue light; and
a second sub-pixel configured to emit different colors of light based on an intensity of an electric field applied thereto,
wherein the second sub-pixel comprises:
a first cathode;
an electron transport region formed below the first cathode;
a color control light-emitting layer formed directly below the electron transport region;
a hole transport region formed directly below the color control light-emitting layer;
an anode formed below the hole transport region;
an insulating layer formed directly below the anode; and
a second cathode formed directly below the insulating layer,
wherein the insulating layer is interposed between the anode and the second cathode,
wherein the second cathode controls the intensity of the electric field, and wherein the color control light-emitting layer comprises a quantum dot light-emitting layer.

2. The display device of claim 1, wherein the anode comprises an electric field transmissive electrode.

3. The display device of claim 1, wherein the second cathode is formed over the color control light-emitting layer and configured to apply an electric field to the color control light-emitting layer so as to control a light-emitting color of the color control light-emitting layer.

4. The display device of claim 3, wherein the light-emitting color has a wavelength in the range from a first wavelength to a second wavelength that are determined based on the electric field.

5. The display device of claim 4, wherein the first wavelength corresponds to a green color, and wherein the second wavelength corresponds to a red color.

6. The display device of claim 5, wherein the first wavelength is about 500 nm, and wherein the second wavelength is about 800 nm.

7. The display device of claim 4, wherein the wavelength of the light-emitting color is configured to become i) shorter as an intensity of the electric field applied to the color control light-emitting layer increases and ii) longer as the intensity of the electric field applied to the color control light-emitting layer decreases.

8. The display device of claim 1, further comprising an image processor configured to process image data corresponding to a layout of the first and second sub-pixels.

9. The display device of claim 8, wherein the image data comprises red, green, and blue data.

10. The display device of claim 9, wherein the image processor is further configured to i) process the image data so as to generate compensation data and ii) output the compensation data.

11. The display device of claim 10, wherein the compensation data comprises anode data corresponding to a voltage applied to the anode, second cathode data corresponding to a voltage applied to the second cathode, and the blue data.

12. The display device of claim 11, wherein the image processor is configured to calculate the anode data based on the following Equation 1, $$C1 = k1 \cdot (R+G), \quad \text{Equation 1}$$

where C1 denotes the anode data, k1 denotes a constant determined depending on the light-emitting efficiency of the color control light-emitting layer, R denotes the red data, and G denotes the green data.

13. The display device of claim 11, wherein the image processor is configured to calculate the second cathode data based on the following Equation 2, $$C2 = k2 \cdot (R/(R+G)) + k3, \quad \text{Equation 2}$$

where C2 denotes the second data, k2 denotes a constant determined depending on the light-emitting efficiency of the color control light-emitting layer, k3 denotes a constant determined depending on a threshold voltage required to drive the color control light-emitting layer, R denotes the red data, and G denotes the green data.

14. The display device of claim 1, wherein the pixels are arranged in first and second directions crossing each other.

15. The display device of claim 14, wherein the first sub-pixels arranged in the first direction are defined as first sub-pixel columns, wherein the second sub-pixels arranged in the first direction are defined as second sub-pixel columns, and wherein the first and second sub-pixel columns are alternately arranged in the second direction.

16. The display device of claim 14, wherein the first and second sub-pixels are alternately arranged in the first and second directions.

17. The display device of claim 1, wherein the entirety of the second sub-pixel is configured to emit the different colors at different points in time.

18. The display device of claim 1, wherein the insulating layer is in direct physical contact with the anode and the second cathode.

19. The display device of claim 1, wherein the anode is closer to the second cathode than the first cathode.

20. A quantum dot light-emitting diode (QD-LED) comprising:
a first cathode;
an electron transport region formed below the first cathode;
a color control light-emitting layer formed directly below the electron transport region;
a hole transport region formed directly below the color control light-emitting layer;
an anode formed below the hole transport region;
an insulating layer formed directly below the anode; and
a second cathode formed directly below the insulating layer,
wherein the insulating layer is interposed between the anode and the second cathode,
wherein the color control light-emitting layer comprises a quantum dot light-emitting layer and configured to emit light having different light-emitting colors based on an electric field applied to the color control light-emitting layer via the second cathode, and
wherein the second cathode controls the intensity of the electric field.

21. The QD-LED of claim 20, wherein the anode comprises an electric field transmissive electrode.

22. The QD-LED claim 20, wherein the light-emitting color has a wavelength in the range from a first wavelength to a second wavelength that are determined based on the electric field.

23. The QD-LED of claim 22, wherein the first wavelength corresponds to a green color, and wherein the second wavelength corresponds to a red color.

24. The QD-LED of claim 23, wherein the first wavelength is about 500 nm, and wherein the second wavelength is about 800 nm.

* * * * *